United States Patent [19]

Kuromitsu et al.

[11] Patent Number: 5,096,768

[45] Date of Patent: Mar. 17, 1992

[54] SUBSTRATE USED FOR FABRICATION OF THICK FILM CIRCUIT

[75] Inventors: Yoshirou Kuromitsu; Hideaki Yoshida; Toshiyuki Nagase; Hiroto Uchida; Tadaharu Tanaka; Yoshio Kanda, all of Saitama; Kenji Morinaga, Fukuoka, all of Japan

[73] Assignee: Mitsubishi Metal Corporation, Tokyo, Japan

[21] Appl. No.: 474,904

[22] Filed: Feb. 5, 1990

[30] Foreign Application Priority Data

| Feb. 3, 1989 | [JP] | Japan | 1-25336 |
| Feb. 7, 1989 | [JP] | Japan | 1-28015 |
| Feb. 7, 1989 | [JP] | Japan | 1-28016 |
| Nov. 7, 1989 | [JP] | Japan | 1-289242 |

[51] Int. Cl.$^5$ .............................. B32B 9/00
[52] U.S. Cl. ........................ 428/209; 428/698; 428/704; 428/901
[58] Field of Search ............ 428/432, 336, 698, 901, 428/209, 704

[56] References Cited

U.S. PATENT DOCUMENTS

| 4,659,611 | 4/1987 | Iwase et al. | 428/698 |
| 4,732,794 | 3/1988 | Hyde | 428/432 |
| 4,806,334 | 2/1989 | Fujinaka et al. | 428/432 |
| 4,820,593 | 4/1989 | Egerton et al. | 428/698 |

Primary Examiner—Patrick J. Ryan
Assistant Examiner—Kam F. Lee
Attorney, Agent, or Firm—Sughrue, Mion, Zinn, Macpeak & Seas

[57] ABSTRACT

An insulating substrate is used for fabrication of a thick film circuit and comprises a foundation of aluminum nitride and a surface film structure provided on the foundation, in which the foundation contains at least one oxidizing agent selected from the group consisting of an yttrium oxide and a calcium oxide ranging from 0.1% to 10% by weight for enhancing a stiffness of the foundation, and in which the surface film structure is of the multi-level surface film structure having a lower surface film of an aluminum oxide rapidly grown on the foundation in the presence of the oxidizing agent and an upper surface film containing a silicon oxide and a substance selected from the group consisting of a zirconium oxide, a titanium oxide and a boron oxide for enhancing the resistivity against a firing operation.

19 Claims, 3 Drawing Sheets

SUBSTRATE USED FOR FABRICATION OF THICK FILM CIRCUIT

FIELD OF THE INVENTION

This invention relates to a substrate and, more particularly, to a substrate suitable for fabrication of a thick film circuit in a high integration density.

DESCRIPTION OF RELATED ARTS

Various insulating substrates are used for fabrication of thick film circuits such as, for example, a hybrid integrated circuits, and are required to be large in heat radiation capability so as to cope with increasing components per a single substrate. An aluminum nitride substrate was proposed as an essential substance of the insulating substrate because the aluminum nitride is larger in thermal conductivity than an aluminum oxide widely used, however, various drawbacks have been encountered in the insulating substrate of aluminum nitride.

Namely, the aluminum nitride is less adhesive with respect to the circuit pattern of a thick film circuit, and, for this reason, the pattern is liable to peel from the insulating substrate. Various surface films are proposed for solving the drawback inherent in the aluminum nitride substrate. First, Japanese Patent Application laid-open (Kokai) No. 62-28847 discloses the structure of an insulating substrate which has a surface film of silicon dioxide. The insulating substrate consists of a foundation of aluminum nitride produced through a sintering process and the surface film of silicon dioxide provided on the major surface of the foundation. The surface film is formed by using a sputtering technique, a sol-gel technique or a chemical vapor deposition technique. On the insulating substrate thus fabricated are printed conductive paste and resistive paste which are fired to form conductive and resistive films, the printing stage and the firing stage are repeated to form conductive and resistive strips which form in combination a circuit pattern. Semiconductor chips and discrete component elements are arranged on the circuit pattern, and a thick film circuit is completed and installed in an electronic system. However, the surface film of silicon dioxide thus provided on the aluminum nitride foundation is less effective for preventing the circuit pattern from peeling off.

Another surface film is disclosed in U.S. Pat. No. 4,659,611. The surface film disclosed in the U.S. Patent is formed of aluminum oxide ($Al_2O_3$) and covers an aluminum nitride foundation. The surface film is formed through, for example, an oxidation stage of the foundation. However, the aluminum oxide surface film hardly provides any drastic solution of the drawback, and the circuit pattern tends to peel from the insulating substrate.

Applicants of this application have contemplated these drawbacks and, especially, studied the reasons why those surface films could not sufficiently improve the adhesion between the aluminum nitride foundation and the circuit pattern. The study resulted in Japanese Patent Application Nos. 63-21579, 63-21580 and 63-24628 which provided the basis of U.S. patent application Ser. No. 07/304,460. Namely, applicants found that silicon oxide enhanced the viscosity of the melted frits contained in the paste by supplying with viscous silicon atoms but was easily consumed by the frits which reacted with aluminum nitride in a high temperature ambient such as the firing stage. As a result of the chemical reaction between the aluminum nitride and the frits, undesirable gases were produced, and such undesirable gases formed bubbles between the aluminum nitride foundation and the circuit pattern. The bubbles were causative of peeling off. On the other hand, the aluminum oxide was so porous that the melted frits easily penetrated through the porous aluminum oxide. The frits thus contacted with the aluminum nitride reacted therewith, and, accordingly, produced the foamable gases. This resulted in reduction of the adhesion between the surface film and the circuit pattern. In the U.S. patent application previously filed proposes a multi-level surface film structure which aims at improvement in the adhesion with respect to the circuit pattern.

SUMMARY OF THE INVENTION

It is an important object of the present invention to provide an insulating substrate which has an aluminum nitride foundation improved in mechanical strength.

It is also an important object of the present invention to provide an insulating substrate which has the lowest film of a multi-level surface film structure improved in density.

It is also an important object of the present invention to provide an insulating substrate which has a multi-level surface film structure resistive to a thermal stress applied in the formation process of a thick film circuit.

In accordance with one aspect of the present invention, there is provided an insulating substrate comprising a) a foundation containing an aluminum nitride, at least one oxidizing agent selected from the group consisting of an yttrium oxide and a calcium oxide and incidental impurities, the oxidizing agent ranging from about 0.1% to about 10% by weight, and b) a multi-level surface film structure having a lower surface film of an aluminum oxide formed on a surface of the foundation and an upper surface film formed on the lower surface film and containing a silicon oxide.

In accordance with another aspect of the present invention, there is provided a multi-level surface film structure forming a part of an insulating substrate and provided on a surface of a foundation, comprising a) a lower surface film of an aluminum oxide formed on the surface of the foundation; and b) an upper surface film formed on the lower surface film and containing a silicon oxide and a substance selected from the group consisting of a zirconium oxide, a titanium oxide and a boron oxide.

In accordance with still another aspect of the present invention, there is provided a thick film circuit comprising a) an insulating substrate having a-1) a foundation containing an aluminum nitride, at least one oxidizing agent selected from the group consisting of a yttrium oxide and a calcium oxide and incidental impurities, a-2) a lower surface film provided on a surface of the foundation and formed of an aluminum oxide, and a-3) an upper surface film provided on the lower surface film and containing a silicon oxide, a substance selected from the group consisting of a zirconium oxide, a titanium oxide and a boron oxide and incidental impurities; b) a conductive circuit pattern formed on the upper surface film and including resistive elements and interconnections; and c) a plurality of circuit components.

BRIEF DESCRIPTION OF THE DRAWINGS

The features and advantages of an insulating substrate according to the present invention will be more clearly understood from the following description taken in conjunction with the accompanying drawings in which.

DESCRIPTION OF THE PREFERRED EMBODIMENTS

First Embodiment

Figure 1:
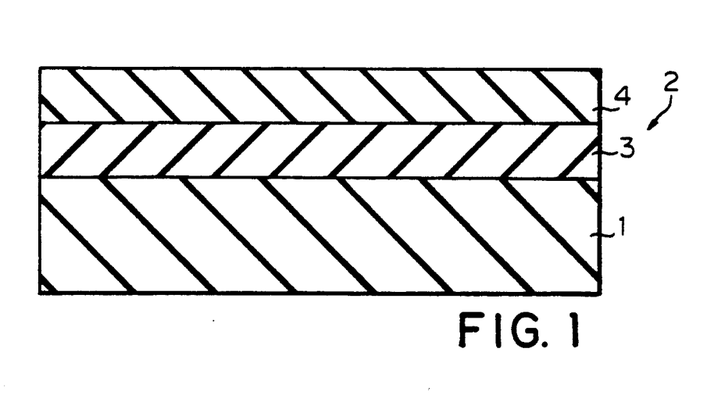
FIG. 1 is a cross sectional view showing the structure of an insulating substrate embodying the present invention.

Referring first to FIG. 1 of the drawings, an insulating substrate embodying the present invention comprises a foundation 1 and a multi-level surface film structure 2, and the multi-level surface film structure 2 has a lower level surface film 3 of an aluminum oxide and an upper level surface film 4 of a silicon oxide. The lower surface film 3 ranges from about 0.2 microns to about 20 microns, and the upper surface film 4 is fallen within a range from about 0.01 micron to about 10 microns. If the lower surface film 3 is less than 0.2 micron, the lower surface film of the aluminum oxide hardly prevents the foundation from frits contained in a paste used for formation of a thick film circuit pattern. On the other hand, a lower surface film greater than 20 microns deteriorates the heat radiation capability of the aluminum nitride film because of a lower thermal conductivity of the aluminum oxide. The reason why the upper surface film 4 needs to be equal to or greater than about 0.01 micron is that the upper surface film 4 with such a large thickness does not consume during a high temperature treatment, i.e., a firing stage for the past, and prevents the foundation from any penetration of the frits. However, the upper surface film 4 greater than about 10 microns also deteriorates the heat radiation capability of the insulating substrate.

In this instance, the aluminum oxide is represented by the molecular formula of $Al_2O_3$, and the silicon oxide is represented by the molecular formula of $SiO_2$.

The foundation contains an oxidizing agent or agents selected from the group consisting of an yttrium oxide (represented by the molecular formula of $Y_2O_3$) and a calcium oxide (represented by the molecular formula of CaO). The oxidizing agent or agents range from about 0.1% to about 10% by weight. Although the foundation contains a negligible amount of incidental impurities, an aluminum nitride substantially occupies the remaining part of the foundation 1. The oxidizing agent or agents accelerate the formation of the lower surface film 3 and further improve the mechanical strength of the foundation because such an agent or agents promote the sintering of the aluminum nitride. Those desirable phenomena can not be hardly achieved in the presence of the agent or agents less than about 0.1% by weight, and the oxidizing agent or agents greater than about 10% by weight are causative of deterioration in the thermal conductivity.

Description is hereinbelow made on a process of fabricating the insulating substrate according to the present invention. The process starts with preparation of ingredient powders of the yttrium oxide, the calcium oxide and the aluminum nitride, and these ingredient powders are about 1 micron to about 3 microns in average diameter. A target, solutions and a gaseous mixture used for formation of the upper surface film 4 will be described hereinafter.

The ingredient powders are regulated and, then, mixed by using a wet ball-mil for about seventy two hours so as to obtain various mixtures different in proportion from one another. The aluminum nitride powder without any oxidizing agent is further prepared for comparative study. The mixtures are dried, and an organic binder is added to the mixtures so that pastes are produced in various proportions. The aluminum nitride powder without any oxidizing agent is also mixed with the organic binder so that a comparative paste is prepared. The mixture with the oxidizing agent or agents are shaped into green sheets by using a doctor-blade technique, and the green sheets are placed in a nitrogen ambient with an atmospheric pressure at about 1800 degrees in centigrade for about 2 hours. The green sheets thus sintered are produced into insulating foundations with compositions indicated in Table 1. The insulating foundations have respective top surfaces each measuring 25.4 millimeter by 25.4 millimeter and are about 0.625 millimeter in thickness. The insulating foundations thus produced are labeled with reference marks P1 to P14.

The comparative paste is also shaped into green sheets, and the green sheets are sintered under the same conditions. The comparative insulating foundations are identical in size with the insulating foundations P1 to P14, and are labeled with reference marks C1 to C3.

TABLE 1

| Reference mark | Composition (by weight %) | | |
| --- | --- | --- | --- |
| | $Y_2O_3$ | CaO | AlN |
| P1 | 0.1 | None | Residual |
| P2 | 2 | None | Residual |
| P3 | 4 | None | Residual |
| P4 | 6 | None | Residual |
| P5 | 8 | None | Residual |
| P6 | 10 | None | Residual |
| P7 | None | 0.1 | Residual |
| P8 | None | 3 | Residual |
| P9 | None | 5 | Residual |
| P10 | None | 7 | Residual |
| P11 | None | 10 | Residual |
| P12 | 0.5 | 0.5 | Residual |
| P13 | 3 | 2 | Residual |
| P14 | 3 | 5 | Residual |
| C1 | None | None | 100 |
| C2 | None | None | 100 |
| C3 | None | None | 100 |

The oxidizing agent or agents promote the sintering phenomena, so that the foundations P1 to P14 are improved in stiffness.

After the formation of the foundations P1 to P14, the foundations are placed in respective oxidizing ambiences, and the aluminum nitride is promptly oxidized in the presence of the oxidizing agent or agents. Thus, the aluminum oxide ($Al_2O_3$) is grown on the surfaces of the foundations P1 to P14, and provides the lower surface films on the foundations P1 to P14. The oxidizing ambiences as well as the average thicknesses are described in Table 2, however, the foundations C1 to C3 are not subjected to the oxidation, and, for this reason, no oxide film is grown on the surfaces thereof.

By virtue of the oxidizing agent or agents, the lower surface films of the aluminum oxide are large in density, and the lower surface films isolate the foundations from printed pastes for circuit patterns, respectively, even though the upper surface films of the silicon oxide are consumed. (blank)

TABLE 2

| Reference mark | The lower surface film of $Al_2O_3$ | | | |
|---|---|---|---|---|
| | $O_2$ Press (atm.) | Oxidation Vapor Press. (atm.) | Temp. (deg.) | Thickness (micron) |
| P1 | 1 | $1 \times 10^{-5}$ | 1350 | 0.22 |
| P2 | ditto | ditto | ditto | 0.5 |
| P3 | ditto | ditto | ditto | 0.9 |
| P4 | ditto | ditto | ditto | 1.2 |
| P5 | ditto | ditto | ditto | 1.8 |
| P6 | 0.5 | $1 \times 10^{-4}$ | 1400 | 2.9 |
| P7 | ditto | ditto | ditto | 3.8 |
| P8 | ditto | ditto | ditto | 4.7 |
| P9 | ditto | ditto | ditto | 6.9 |
| P10 | 0.1 | $1 \times 10^{-3}$ | 1450 | 8.6 |
| P11 | ditto | ditto | ditto | 11.4 |
| P12 | ditto | ditto | ditto | 15.6 |
| P13 | ditto | ditto | ditto | 17.6 |
| P14 | ditto | ditto | ditto | 19.6 |
| C1 to C3 | (No oxidation) | | | |

(blank)

The oxidations are followed by formation of the upper surface films on the respective lower surface films. Various techniques are available for formation of the upper surface films, however, a sputtering, a sol-gel method and a photo assisted CVD (Chemical Vapor Deposition) are tried in these instances. The comparative foundations C1 to C3 are also covered with the silicon oxide film through the three processes, respectively.

A quartz target with purity of about 99.9% is prepared for the sputtering, and the quartz target is about 3 millimeters in diameter and about 10 millimeters in height. The target is installed in an RF sputtering system, and the foundations covered with or without the lower surface films are confronted with the quartz target. The foundations are rotated at about 10 rpm, and the sputtering is carried out at about 100 watts for respective time period depending upon the thickness of the upper surface film.

In the sol-gel coating, a spray with a colloidal solution and a firing stage are repeated a predetermined times, and the predetermined times depend upon the thickness of the upper surface film. The colloidal solution is prepared by mixing the 347 grams of ethyl silicate, 500 grams of ethyl alcohol and 190.2 grams of diluted hydrochloric acid which is of the order of 0.3%, and the spray is carried out under the rotation of the foundations covered with or without the lower surface films at about 500 rpm for about 10 seconds. The foundations thus sprayed are placed in a high temperature ambient at about 900 degrees in centigrade for about 10 minutes for the firing stage.

The chemical vapor deposition is assisted by radiation of a mercury lamp, and the reactants are a gaseous mixture of silane and oxygen. The proportion of silane to oxygen is about 0.015. The foundations covered with or without the lower surface films are placed in a low pressure ambient of about 0.2 torr, and are heated to about 150 degrees in centigrade. The deposition time period depends upon the thickness of the upper surface film. The formation technique applied to each foundation is indicated in Table 3 together with the thickness of the upper surface film. (blank)

TABLE 3

| Reference mark | The upper surface film of silicon oxide | |
|---|---|---|
| | Formation technique | Thickness (micron) |
| P1 | Photo assisted CVD | 0.013 |
| P2 | Sputtering | 0.05 |
| P3 | Sol-gel | 0.17 |
| P4 | Photo assisted CVD | 0.36 |
| P5 | Sol-gel | 0.57 |
| P6 | ditto | 0.78 |
| P7 | Sputtering | 0.82 |
| P8 | Sol-gel | 1.20 |
| P9 | Sputtering | 1.82 |
| P10 | Sol-gel | 2.60 |
| P11 | ditto | 3.71 |
| P12 | Sputtering | 0.01 |
| P13 | Sol-gel | 0.50 |
| P14 | ditto | 9.83 |
| C1 | Photo assisted CVD | 0.012 |
| C2 | Sputtering | 1.9 |
| C3 | Sol-gel | 8.61 |

Figure 2:
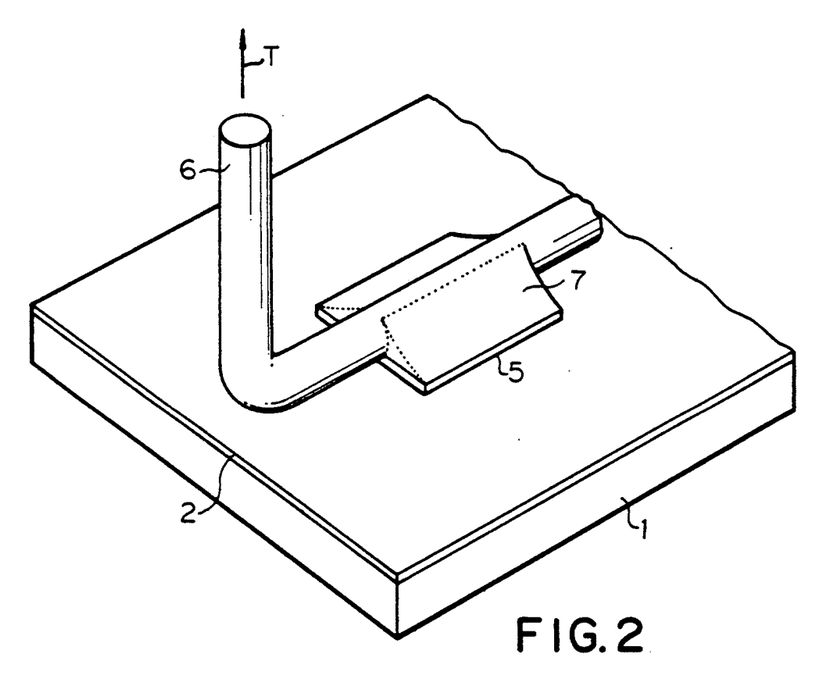
FIG. 2 is a perspective view showing, in a modeled form, a measuring instrument for a peeling strength achieved by a surface film structure.

The thermal conductivities of the insulating substrates (which are also labeled with the reference marks P1 to P14 and C1 to C3, respectively) are measured by using a laser flashing technique, and peeling resistances or peeling strengths are further measured for evaluation of bonding forces between the multi-level surface film structures and the circuits patterns, respectively, by using the following arrangement. Namely, a conductive paste formed from a palladium alloy powder containing 20% silver by weight is screen printed on the insulating substrates P1 to P14 and C1 to C3, and each paste thus printed occupies about 2 millimeters by about 2 millimeters. The square shaped paste films are dried at 125 degrees in centigrade for about 10 minutes, and are, then, fired at about 850 degrees in centigrade for about 10 minutes. On each of the paste films 5 thus fired is placed a generally L-shaped non-oxidized copper wire 6 which is soldered to the paste film 5 at about 215 degrees in centigrade. The non-oxidized copper wire 6 is about 0.9 millimeter in diameter, and a tin-lead eutectic crystal solder 7 is used for bonding. The non-oxidized copper wire 6 is pulled in a direction indicated by arrow T, and the force is gradually increased until the paste film 5 peels from the insulating substrate. The maximum force is divided by the occupying area of the paste film 5, and the force per unit area is defined as "peeling strength".

The heat conductivities and the peeling strengths are indicated in Table 4 for the individual insulating substrates P1 to P14 and C1 to C3. As will be understood from Table 4, the peeling strength of each insulating substrate according to the present invention is roughly ten times larger than that of the comparative insulating substrate without any substantial sacrifice of the heat conductivity. (blank)

TABLE 4

| Reference mark | Heat Conductivity (cal/sec. cm. deg) | Peeling strength (kg/4 mm²) |
| --- | --- | --- |
| P1 | 0.616 | 4.2 |
| P2 | 0.609 | 4.3 |
| P3 | 0.607 | 4.4 |
| P4 | 0.599 | 4.4 |
| P5 | 0.597 | 4.7 |
| P6 | 0.586 | 4.8 |
| P7 | 0.581 | 4.9 |
| P8 | 0.577 | 4.7 |
| P9 | 0.576 | 4.9 |
| P10 | 0.555 | 4.6 |
| P11 | 0.522 | 4.4 |
| P12 | 0.464 | 4.2 |
| P13 | 0.425 | 4.1 |
| P14 | 0.419 | 4.0 |
| C1 | 0.617 | 0.1 |
| C2 | 0.596 | 0.2 |
| C3 | 0.434 | 0.3 |

(blank)

Figure 3:
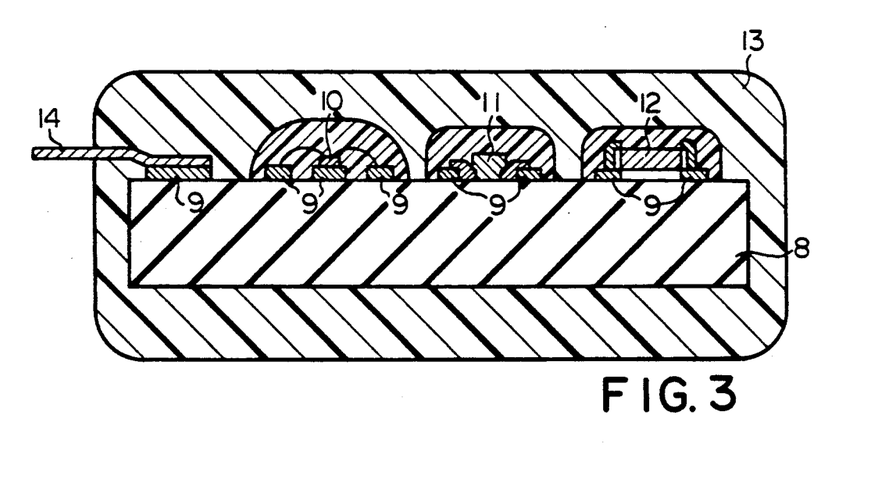
FIG. 3 is cross sectional view showing a hybrid circuit fabricated on the insulating substrate shown in FIG. 1.

The insulating substrate according to the present invention is suitable for a hybrid integrated circuit by way of example. FIG. 3 shows the structure of a hybrid integrated circuit which is fabricated on an insulating substrate 8 according to the present invention. On the insulating substrate 8 is formed a conductive pattern 9 which provides interconnections between a single chip integrated circuit 10, a resistive pattern 11 and another chip element 12. The component elements 10 to 12 thus mounted on the insulating substrate 8 are sealed in a synthetic resin 13, and outer leads are projected from the synthetic resin 13 for communication with an external system (not shown). One of the outer leads is shown and designated by reference numeral 14.

The insulating substrate according to the present invention per se provides a rigid circuit substrate of an electric or electronic circuit, however, a multi-level circuit substrate may be fabricated by using a plurality of insulating substrates according to the present invention. Namely, a circuit pattern is formed on each of the insulating substrates, and a adhesive paste is prepared by mixing a glass powder such as, for example, boron-silicate glass and an organic binder. The adhesive paste is printed on the insulating substrates, and the insulating substrates thus printed with the adhesive paste are laminated to form a multi-level structure. The multi-level structure is heated to a certain temperature over the softening point of the glass powder so that a multi-level circuit substrate is completed.

Second Embodiment

Figure 4:
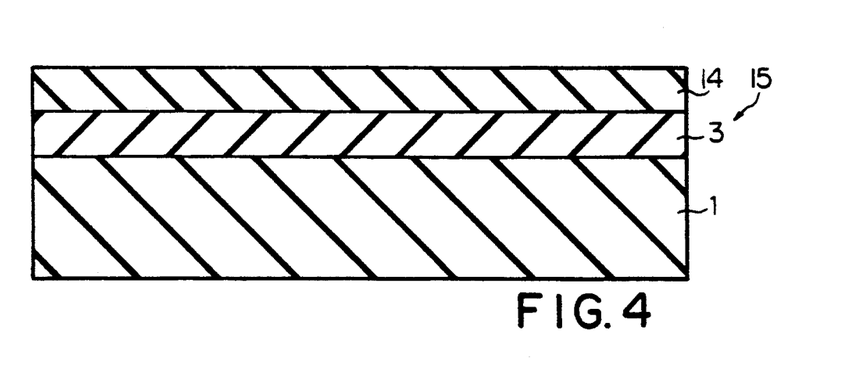
FIG. 4 is a cross sectional view showing the structure of another insulating substrate embodying the present invention.

Turning to FIG. 4 of the drawings, another insulating substrate according to the present invention is illustrated. The insulating substrate is similar to that shown in FIG. 1 with the exception of an upper surface film 14 which forms a part of a multi-level surface film structure 15, and, for this reason, the other component parts are designated by the same reference numerals used in FIG. 1.

The upper surface film 14 contains a zirconium oxide, a silicon oxide and incidental impurities, and the zirconium oxide ranges from about 10% to about 65% by weight. The upper surface film 14 is about 0.01 micron to about 10 microns in average thickness. In this instance, the zirconium oxide is represented by the molecular formula of $ZrO_2$, and the silicon oxide is represented by the molecular formula of $SiO_2$. The oxidizing agent content is fallen within the range from about 0.1% to about 10% by weight, and the lower surface film 3 ranges from about 0.2 micron to about 20 microns in average thickness. These ranges are selected with the same reasons as the first embodiment.

The zirconium oxide thus contained in the upper surface film 14 enhances the resistivity against the repetition of heat, and is effective for improvement in adhesion between the insulating substrate and a circuit pattern. However, the zirconium oxide content less than 10% by weight hardly achieves these advantages. If the zirconium oxide is greater than 65% by weight, the circuit pattern formed is too small to enhance the viscosity of the melted frits contained in the paste for improvement in adhesion between the lower surface film 3 and the circuit pattern. Thus, the zirconium oxide content is fallen within the above range.

The upper surface film 14 less than about 0.01 micron results in the fact that the circuit pattern peels from the insulating substrate within a relatively short service time period, and the large heat radiation capability of the foundation 1 is canceled by the upper surface film 14 greater than about 10 microns. These are the reason for the above mentioned range.

Description is made on a process of forming the insulating substrate shown in FIG. 4. The process starts with preparation of ingredient powders of the yttrium oxide, the calcium oxide and the aluminum nitride, and these ingredient powders are about 1 micron to about 3 microns in average diameter. Solutions used for formation of the upper surface film 14 will be described hereinafter.

The ingredient powders are regulated and, then, mixed by using a wet ball-mil for about seventy two hours so as to obtain various mixtures different in proportion from one another. The aluminum nitride powder without any oxidizing agent is further prepared for comparative study. The mixtures are dried, and an organic binder is added to the mixtures so that pastes are produced in various proportions. The aluminum nitride powder without any oxidizing agent is also mixed with the organic binder so that a comparative paste is prepared. The mixture with the oxidizing agent or agents are shaped into green sheets by using a doctor-blade technique, and the green sheets are placed in a nitrogen ambient with an atmospheric pressure at about 1800 degrees in centigrade for about 2 hours. The green sheets thus sintered are produced into insulating foundations with compositions indicated in Table 5. The insulating foundations have respective top surfaces each measuring 25.4 millimeter by 25.4 millimeter and are about 0.625 millimeter in thickness. The insulating foundations thus produced are labeled with reference marks P21 to P34.

The comparative paste is also shaped into green sheets, and the green sheets are sintered under the same conditions. The comparative insulating foundations are identical in size with the insulating foundations P21 to P34, and are labeled with reference marks C11 to C13. (blank)

TABLE 5

| Reference mark | Composition (by weight %) | | |
| --- | --- | --- | --- |
| | $Y_2O_3$ | CaO | AlN |
| P21 | 0.1 | None | Residual |
| P22 | 2 | None | Residual |
| P23 | 4 | None | Residual |
| P24 | 6 | None | Residual |
| P25 | 8 | None | Residual |
| P26 | 10 | None | Residual |

TABLE 5-continued

| Reference mark | Composition (by weight %) | | |
|---|---|---|---|
| | $Y_2O_3$ | CaO | AlN |
| P27 | None | 0.1 | Residual |
| P28 | None | 3 | Residual |
| P29 | None | 5 | Residual |
| P30 | None | 7 | Residual |
| P31 | None | 10 | Residual |
| P32 | 0.5 | 0.5 | Residual |
| P33 | 3 | 2 | Residual |
| P34 | 3 | 5 | Residual |
| C11 | None | None | 100 |
| C12 | None | None | 100 |
| C13 | None | None | 100 |

The insulating foundations P21 to P34 are, then, subjected to oxidation for formation of the lower surface films, respectively, however, no oxidation is carried out for the comparative foundations C11 to C13. The oxidizing ambient as well as the thickness of each lower surface film are described in Table 6.

TABLE 6

| | The lower surface film of $Al_2O_3$ | | | |
|---|---|---|---|---|
| Reference mark | $O_2$ Press (atm.) | Oxidation Vapor Press. (atm.) | Temp. (deg.) | Thickness (micron) |
| P21 | 1 | $1 \times 10^{-5}$ | 1350 | 0.21 |
| P22 | ditto | ditto | ditto | 0.9 |
| P23 | ditto | ditto | ditto | 1.5 |
| P24 | ditto | ditto | ditto | 3.2 |
| P25 | ditto | ditto | ditto | 19.9 |
| P26 | 0.5 | $1 \times 10^{-4}$ | 1400 | 1.5 |
| P27 | ditto | ditto | ditto | 3.4 |
| P28 | ditto | ditto | ditto | 4.9 |
| P29 | ditto | ditto | ditto | 6.7 |
| P30 | 0.1 | $1 \times 10^{-3}$ | 1450 | 0.9 |
| P31 | ditto | ditto | ditto | 1.5 |
| P32 | ditto | ditto | ditto | 7.2 |
| P33 | ditto | ditto | ditto | 8.5 |
| P34 | ditto | ditto | ditto | 15.6 |
| C11 to C13 | (No oxidation) | | | |

After the formation of the lower surface films, the upper surface films are formed through a sol-gel film coating process. However, the comparative foundations C11 to C13 are coated with respective silicon oxide films through another sol-gel film coating process. In the sol-gel coating, a spray with a colloidal solution and a firing stage are repeated a predetermined times, and the predetermined times depend upon the thickness of the upper surface film.

For the upper surface films, a first solution is prepared by mixing 250 grams of ethyl silicate and 500 grams of ethyl alcohol, and a second solution contains 1500 grams of isopropyl alcohol and 600 grams of zirconium tetrabutoxyd. The first and second solutions are mixed in various proportions for producing various colloidal solutions. These colloidal solutions are respectively sprayed onto the lower surface films of the insulating foundations P21 to P34 at about 500 rpm. The colloidal solutions are dried in the atmospheric ambient at about 900 degrees in centigrade for about an hour. The spray stage and dry stage are repeated predetermined times, then the upper surface films are formed on the respective lower surface films as shown in Table 7.

Another colloidal solution is prepared by mixing the 347 grams of ethyl silicate, 500 grams of ethyl alcohol and 190.2 grams of diluted hydrochloric acid which is of the order of 0.3%, and the spray is carried out under the rotation of the foundations C11 to C13 at about 500 rpm for about 10 seconds. The foundations C11 to C13 thus sprayed are placed in a high temperature ambient at about 900 degrees in centigrade for about 10 minutes for the firing stage. The spray stage and the firing stage are repeated predetermined times, respectively, so that the silicon oxide films are formed on the comparative foundations C11 to C13, respectively. The upper film and the silicon oxide film are spray coated, however, the foundations may be dipped into the colloidal solutions for coating the upper film or the silicon oxide film.

TABLE 7

| | The upper surface film and $SiO_2$ film | |
|---|---|---|
| Reference mark | The content of $ZrO_2$ | Thickness (micron) |
| P21 | 10.2 | 0.11 |
| P22 | 20.3 | 0.52 |
| P23 | 30.4 | 0.012 |
| P24 | 50.2 | 0.84 |
| P25 | 64.3 | 9.92 |
| P26 | 30.2 | 0.09 |
| P27 | 40.1 | 0.63 |
| P28 | 50.0 | 0.71 |
| P29 | 50.2 | 6.80 |
| P30 | 20.3 | 0.31 |
| P31 | 30.1 | 0.05 |
| P32 | 40.5 | 1.01 |
| P33 | 64.8 | 0.72 |
| P34 | 60.2 | 2.63 |
| C11 | $SiO_2$ | 0.014 |
| C12 | ditto | 2.14 |
| C13 | ditto | 8.35 |

The heat conductivity and the peeling strength are measured for the insulating substrates P21 to P34 and the comparative insulating substrates C11 to C13, and the peeling strength is measured not only immediately after the completion of the upper surface film or the silicon oxide film but also after repetition of a heat treatment. Namely, each of the insulating substrate P21 to P34 and C11 to C13 is heated to about 165 degrees in centigrade, being maintained for about 30 minutes, then being cooled at $-55$ degrees in centigrade for maintenance for about 30 minutes. The heat cycle between $+165$ degrees and $-55$ degrees is repeated a thousand times, and the peeling strength is, thereafter, measured. The laser flashing method is applied for the measurement of the heat conductivity, and the same tool shown in FIG. 2 is used for the measurement of the peeling strengths. The results are indicated in Table 8.

TABLE 8

| Reference mark | Heat Conductivity (cal/sec. cm. deg) | Peeling strength (kg/4 $mm^2$) | |
|---|---|---|---|
| | | immediately | Repetition |
| P21 | 0.591 | 3.9 | 3.8 |
| P22 | 0.580 | 4.3 | 4.2 |
| P23 | 0.601 | 4.1 | 4.1 |
| P24 | 0.541 | 4.8 | 4.6 |
| P25 | 0.421 | 4.0 | 3.8 |
| P26 | 0.592 | 4.2 | 4.2 |
| P27 | 0.540 | 4.9 | 4.7 |
| P28 | 0.602 | 4.8 | 4.8 |
| P29 | 0.454 | 4.2 | 4.1 |
| P30 | 0.590 | 4.2 | 4.1 |
| P31 | 0.600 | 4.1 | 3.9 |
| P32 | 0.502 | 4.7 | 4.6 |
| P33 | 0.526 | 4.9 | 4.9 |
| P34 | 0.492 | 5.2 | 4.8 |
| C11 | 0.604 | 0.2 | 0 |
| C12 | 0.521 | 0.1 | 0 |

TABLE 8-continued

| Reference mark | Heat Conductivity (cal/sec. cm. deg) | Peeling strength (kg/4 mm²) immediately | Repetition |
|---|---|---|---|
| C13 | 0.481 | 0.3 | 0 |

As will be understood from Table 8, the insulating substrates according to the present invention are large in peeling strength without any sacrifice of the heat conductivity, and the heat cycles do not deteriorate the peeling strength due to the zirconium oxide contained in the upper surface films.

The insulating substrate shown in FIG. 4 may be also used for fabrication of a multi-level circuit substrate.

Third Embodiment

Figure 5:
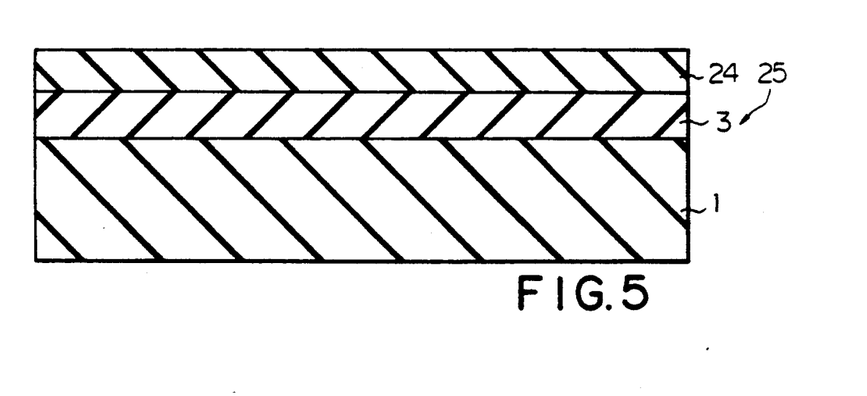
FIG. 5 is a cross sectional view showing the structure of still another insulating substrate embodying the present invention.

Turning to FIG. 5 of the drawings, another insulating substrate according to the present invention is illustrated. The insulating substrate is similar to that shown in either FIG. 1 or FIG. 4 with the exception of an upper surface film 24 which forms a part of a multi-level surface film structure 25, and, for this reason, the other component parts are designated by the same reference numerals used in FIG. 1.

The upper surface film 24 contains a titanium oxide, a silicon oxide and incidental impurities, and the titanium oxide ranges from about 10% to about 65% by weight. The upper surface film 24 is about 0.01 micron to about 10 microns in average thickness. In this instance, the titanium oxide is represented by the molecular formula of $TiO_2$, and the silicon oxide is represented by the molecular formula of $SiO_2$. The oxidizing agent content is fallen within the range from about 0.1% to about 10% by weight, and the lower surface film 3 ranges from about 0.2 micron to about 20 microns in average thickness. These ranges are selected with the same reasons as the first embodiment.

The titanium oxide thus contained in the upper surface film 24 enhances the resistivity against the repetition of heat treatment and is effective for improvement in adhesion between the insulating substrate and a circuit pattern as similar to the zirconium oxide. The titanium oxide content less than 10% by weight hardly achieves these advantages. If the titanium oxide is greater than 65% by weight, the circuit pattern formed thereon tends to peel off because the silicon oxide content is too small to enhance the viscosity of the melted frits contained in the paste for improvement in adhesion between the insulating substrate and the circuit pattern. Thus, the titanium oxide content is fallen within the above range.

The upper surface film 24 less than about 0.01 micron results in the fact that the circuit pattern peels from the insulating substrate within a relatively short service time period, and the large heat radiation capability of the foundation 1 is canceled by the upper surface film 14 greater than about 10 microns. These are the reason for the above mentioned range.

Description is made on a process of forming the insulating substrate shown in FIG. 5. The process starts with preparation of ingredient powders of the yttrium oxide, the calcium oxide and the aluminum nitride, and these ingredient powders are about 1 micron to about 3 microns in average diameter.

The ingredient powders are regulated and, then, mixed by using a wet ball-mil for about seventy two hours so as to obtain various mixtures different in proportion from one another. The aluminum nitride powder without any oxidizing agent is further prepared for comparative study. The mixtures are dried, and an organic binder is added to the mixtures so that pastes are produced in various proportions. The aluminum nitride powder without any oxidizing agent is also mixed with the organic binder so that a comparative paste is prepared. The mixture with the oxidizing agent or agents are shaped into green sheets by using a doctor-blade technique, and the green sheets are placed in a nitrogen ambient with an atmospheric pressure at about 1800 degrees in centigrade for about 2 hours. The green sheets thus sintered are produced into insulating foundations with compositions indicated in Table 9. The insulating foundations have respective top surfaces each measuring 25.4 millimeter by 25.4 millimeter and are about 0.625 millimeter in thickness. The insulating foundations thus produced are labeled with reference marks P41 to P54.

The comparative paste is also shaped into green sheets, and the green sheets are sintered under the same conditions. The comparative insulating foundations are identical in size with the insulating foundations P41 to P54, and are labeled with reference marks C21 to C23. (blank)

TABLE 9

| Reference mark | Composition (by weight %) | | |
|---|---|---|---|
| | $Y_2O_3$ | CaO | AlN |
| P41 | 0.1 | None | Residual |
| P42 | 2 | None | Residual |
| P43 | 4 | None | Residual |
| P44 | 6 | None | Residual |
| P45 | 8 | None | Residual |
| P46 | 10 | None | Residual |
| P47 | None | 0.1 | Residual |
| P48 | None | 3 | Residual |
| P49 | None | 5 | Residual |
| P50 | None | 7 | Residual |
| P51 | None | 10 | Residual |
| P52 | 0.5 | 0.5 | Residual |
| P53 | 3 | 2 | Residual |
| P54 | 3 | 5 | Residual |
| C21 | None | None | 100 |
| C22 | None | None | 100 |
| C23 | None | None | 100 |

(blank)

The insulating foundations P41 to P54 are, then, subjected to oxidation for formation of the lower surface films, respectively, however, no oxidation is carried out for the comparative foundations C21 to C23. The oxidizing ambient as well as the thickness of each lower surface film are described in Table 10. (blank)

TABLE 10

| | The lower surface film of $Al_2O_3$ | | | |
|---|---|---|---|---|
| Reference mark | $O_2$ Press. (atm.) | Oxidation Vapor Press. (atm.) | Temp. (deg.) | Thickness (micron) |
| P41 | 1 | $1 \times 10^{-5}$ | 1350 | 0.29 |
| P42 | ditto | ditto | ditto | 1.0 |
| P43 | ditto | ditto | ditto | 1.5 |
| P44 | ditto | ditto | ditto | 3.6 |
| P45 | ditto | ditto | ditto | 19.7 |
| P46 | 0.5 | $1 \times 10^{-4}$ | 1400 | 0.21 |
| P47 | ditto | ditto | ditto | 3.6 |
| P48 | ditto | ditto | ditto | 4.9 |
| P49 | ditto | ditto | ditto | 6.6 |
| P50 | 0.1 | $1 \times 10^{-3}$ | 1450 | 0.8 |
| P51 | ditto | ditto | ditto | 1.7 |
| P52 | ditto | ditto | ditto | 7.8 |
| P53 | ditto | ditto | ditto | 8.4 |
| P54 | ditto | ditto | ditto | 12.7 |

TABLE 10-continued

| Reference mark | The lower surface film of Al$_2$O$_3$ | | | |
|---|---|---|---|---|
| | O$_2$ Press. (atm.) | Oxidation Vapor Press. (atm.) | Temp. (deg.) | Thickness (micron) |
| C21 to C23 | (No oxidation) | | | |

(blank)

After the formation of the lower surface films, the upper surface films are formed through a sol-gel film coating process. However, the comparative foundations C21 to C23 are coated with respective silicon oxide films through another sol-gel film coating process. In the sol-gel coating, a spray with a colloidal solution and a firing stage are repeated a predetermined times, and the predetermined times depend upon the thickness of the upper surface film.

For the upper surface films, a first solution is prepared by mixing 250 grams of ethyl silicate and 500 grams of ethyl alcohol, and a second solution contains 500 grams of isopropyl alcohol and 300 grams of titanium tetra-isopropoxyd. The first and second solutions are mixed into various proportions for respective colloidal solutions. These colloidal solutions are respectively sprayed onto the lower surface films of the insulating foundations P41 to P54 at about 500 rpm. The colloidal solutions are dried in the atmospheric ambient at about 900 degrees in centigrade for about an hour. The spray stage and dry stage are repeated predetermined times, then the upper surface films are formed on the respective lower surface films as shown in Table 11.

Another colloidal solution is prepared by mixing the 347 grams of ethyl silicate, 500 grams of ethyl alcohol and 190.2 grams of diluted hydrochloric acid which is of the order of 0.3%, and the spray is carried out under the rotation of the foundations C21 to C23 at about 500 rpm for about 10 seconds. The foundations C21 to C23 thus sprayed are placed in a high temperature ambient at about 900 degrees in centigrade for about 10 minutes for the firing stage. The spray stage and the firing stage are repeated predetermined times, respectively, so that the silicon oxide films are formed on the comparative foundations C21 to C23, respectively. The upper film and the silicon oxide film are spray coated, however, the foundations may be dipped into the colloidal solutions for coating the upper film or the silicon oxide film.
(blank)

TABLE 11

| Reference mark | The upper oxide of silicon oxide | |
|---|---|---|
| | The content of TiO$_2$ | Thickness (micron) |
| P41 | 10.1 | 0.20 |
| P42 | 20.2 | 0.41 |
| P43 | 30.0 | 0.012 |
| P44 | 40.3 | 0.61 |
| P45 | 60.4 | 9.91 |
| P46 | 30.9 | 0.13 |
| P47 | 19.1 | 0.64 |
| P48 | 38.6 | 0.93 |
| P49 | 40.1 | 6.62 |
| P50 | 19.8 | 0.31 |
| P51 | 41.0 | 0.05 |
| P52 | 10.2 | 1.22 |
| P53 | 50.2 | 0.63 |
| P54 | 64.8 | 2.71 |
| C21 | SiO$_2$ | 0.014 |
| C22 | ditto | 2.14 |
| C23 | ditto | 8.35 |

The heat conductivity and the peeling strength are measured for the insulating substrates P41 to P54 and the comparative insulating substrates C21 to C23, and the peeling strength is measured not only immediately after the completion of the upper surface film or the silicon oxide film but also after repetition of a heat treatment. Namely, each of the insulating substrate P41 to P54 and C21 to C23 is heated to about 165 degrees in centigrade, being maintained for about 30 minutes, then being cooled at −55 degrees in centigrade for maintenance for about 30 minutes. The heat cycle between +165 degrees and −55 degrees is repeated a thousand times, and the peeling strength is, thereafter, measured again. The laser flashing method is applied for the measurement of the heat conductivity, and the same tool shown in FIG. 2 is used for the measurement of the peeling strengths. The results are indicated in Table 12.
(blank)

TABLE 12

| Reference mark | Heat Conductivity (cal/sec. cm. deg) | Peeling Strength (kg/4 mm$^2$) | |
|---|---|---|---|
| | | Immediately | Repetition |
| P41 | 0.586 | 4.1 | 4.1 |
| P42 | 0.576 | 4.4 | 4.4 |
| P43 | 0.600 | 4.1 | 3.9 |
| P44 | 0.562 | 4.9 | 4.7 |
| P45 | 0.417 | 4.2 | 4.2 |
| P46 | 0.592 | 4.2 | 4.1 |
| P47 | 0.540 | 4.8 | 4.8 |
| P48 | 0.597 | 4.8 | 4.6 |
| P49 | 0.454 | 4.1 | 3.9 |
| P50 | 0.592 | 4.2 | 4.2 |
| P51 | 0.603 | 4.1 | 4.0 |
| P52 | 0.497 | 4.9 | 4.9 |
| P53 | 0.523 | 4.8 | 4.7 |
| P54 | 0.510 | 4.6 | 4.6 |
| C21 | 0.604 | 0.2 | 0 |
| C22 | 0.521 | 0.1 | 0 |
| C23 | 0.481 | 0.3 | 0 |

As will be understood from the foregoing description with reference to Table 12, the insulating substrate according to the present invention is advantageous in the peeling strength without any sacrifice of the heat conductivity. The insulating substrate of the present invention well withstands any heat treatment, so that the thick film circuit fabricated on the insulating substrate is increased in reliability, because the upper surface film is less liable to peel from the lower surface film during the fabrication process of the thick film circuit. The insulating substrate shown in FIG. 5 may be also used for fabrication of a multi-level circuit substrate.

Fourth Embodiment

Figure 6:
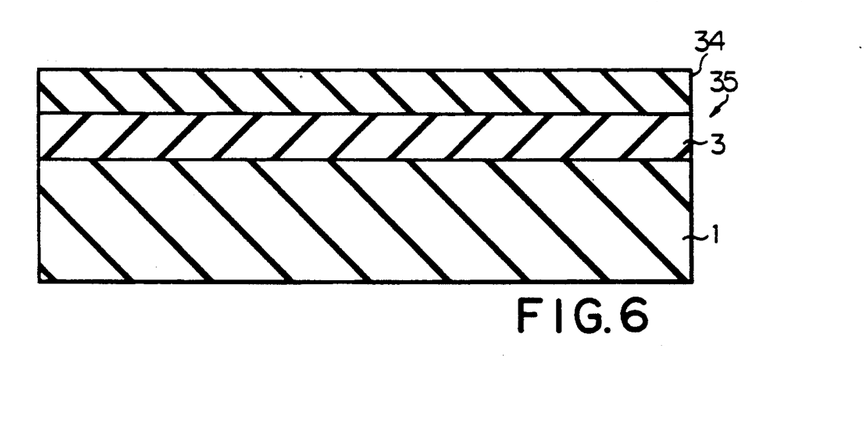
FIG. 6 is a cross sectional view showing the structure of still another insulating substrate embodying the present invention.

Turning to FIG. 6 of the drawings, another insulating substrate according to the present invention is illustrated. The insulating substrate is similar to that shown in either FIGS. 1, 4 or 5 with the exception of an upper surface film 34 which forms a part of a multi-level surface film structure 35, and, for this reason, the other component parts are designated by the same reference numerals used in FIG. 1.

The upper surface film 34 contains a boron oxide, a silicon oxide and incidental impurities, and the boron oxide ranges from about 5% to about 50% by weight. The upper surface film 34 is about 0.01 micron to about 10 microns in average thickness. In this instance, the boron oxide is represented by the molecular formula of $B_2O_2$, and the silicon oxide is represented by the molecular formula of $SiO_2$. The oxidizing agent content is fallen within the range from about 0.1% to about 10% by weight, and the lower surface film 3 ranges from about 0.2 micron to about 20 microns in average thickness. These ranges are selected with the same reasons as the first embodiment.

The boron oxide thus contained in the upper surface film 34 in the form of a solid solution is resistive against a repeated heat treatment encountered in a fabrication process of a thick film circuit and is, accordingly, effective for enhancement of adhesion between the insulating substrate and a thick film circuit pattern. In other words, the upper surface film 34 featuring the present invention provides a prolonged service life to the insulating substrate. The boron oxide content less than 5% by weight hardly achieves these advantages. If the boron oxide is greater than 50% by weight, the circuit pattern formed thereon tends to peel off because the silicon oxide content is too small to enhance the viscosity of the melted frits contained in the paste for improvement in adhesion between the insulating substrate and the circuit pattern. Thus, the boron oxide content is fallen within the above range.

The upper surface film 34 less than about 0.01 micron results in the fact that the circuit pattern peels from the insulating substrate within a relatively short service time period, and the large heat radiation capability of the foundation 1 is canceled by the upper surface film 34 greater than about 10 microns. These are the reason for the above mentioned range.

Description is made on a process of forming the insulating substrate shown in FIG. 6. The process starts with preparation of ingredient powders of the yttrium oxide, the calcium oxide and the aluminum nitride, and these ingredient powders are about 1 micron to about 3 microns in average diameter.

The ingredient powders are regulated and, then, mixed by using a wet ball-mil for about seventy two hours so as to obtain various mixtures different in proportion from one another. The aluminum nitride powder without any oxidizing agent is further prepared for comparative study. The mixtures are dried, and an organic binder is added to the mixtures so that pastes are produced in various proportions. The aluminum nitride powder without any oxidizing agent is also mixed with the organic binder so that a comparative paste is prepared. The mixture with the oxidizing agent or agents are shaped into green sheets by using a doctor-blade technique, and the green sheets are placed in a nitrogen ambient with an atmospheric pressure at about 1800 degrees in centigrade for about 2 hours. The green sheets thus sintered are produced into insulating foundations with compositions indicated in Table 13. The insulating foundations have respective top surfaces each measuring 25.4 millimeter by 25.4 millimeter and are about 0.625 millimeter in thickness. The insulating foundations thus produced are labeled with reference marks P61 to P74.

The comparative paste is also shaped into green sheets, and the green sheets are sintered under the same conditions. The comparative insulating foundations are identical in size with the insulating foundations P61 to P74, and are labeled with reference marks C31 to C33. (blank)

TABLE 13

| Reference mark | Composition (by weight %) | | |
|---|---|---|---|
| | Y₂O₃ | CaO | AlN |
| P61 | 0.1 | None | Residual |

TABLE 13-continued

| Reference mark | Composition (by weight %) | | |
|---|---|---|---|
| | Y₂O₃ | CaO | AlN |
| P62 | 2 | None | Residual |
| P63 | 4 | None | Residual |
| P64 | 6 | None | Residual |
| P65 | 8 | None | Residual |
| P66 | 10 | None | Residual |
| P67 | None | 0.1 | Residual |
| P68 | None | 3 | Residual |
| P69 | None | 5 | Residual |
| P70 | None | 7 | Residual |
| P71 | None | 10 | Residual |
| P72 | 0.5 | 0.5 | Residual |
| P73 | 3 | 2 | Residual |
| P74 | 3 | 5 | Residual |
| C31 | None | None | 100 |
| C32 | None | None | 100 |
| C33 | None | None | 100 |

(blank)

The insulating foundations P61 to 754 are, then, subjected to oxidation for formation of the lower surface films, respectively; however, no oxidation is carried out for the comparative foundations C31 to C33. The oxidizing ambient as well as the thickness of each lower surface film are described in Table 14. (blank)

TABLE 14

| | The lower surface film of Al₂O₃ | | | |
|---|---|---|---|---|
| Reference mark | O₂ Press. (atm.) | Oxidation Vapor Press. (atm.) | Temp. (deg.) | Thickness (micron) |
| P61 | 1 | 1 × 10⁻⁵ | 1350 | 0.2 |
| P62 | ditto | ditto | ditto | 0.8 |
| P63 | ditto | ditto | ditto | 1.5 |
| P64 | ditto | ditto | ditto | 1.5 |
| P65 | ditto | ditto | ditto | 3.1 |
| P66 | 0.5 | 1 × 10⁻⁴ | 1400 | 1.4 |
| P67 | ditto | ditto | ditto | 3.5 |
| P68 | ditto | ditto | ditto | 4.8 |
| P69 | ditto | ditto | ditto | 6.6 |
| P70 | 0.1 | 1 × 10⁻³ | 1450 | 0.9 |
| P71 | ditto | ditto | ditto | 1.5 |
| P72 | ditto | ditto | ditto | 7.3 |
| P73 | ditto | ditto | ditto | 8.4 |
| P74 | ditto | ditto | ditto | 15.4 |
| C31 to C33 | (No oxidation) | | | |

(blank)

After the formation of the lower surface films, the upper surface films are formed through a sol-gel film coating process. However, the comparative foundations C31 to C33 are coated with respective silicon oxide films through another sol-gel film coating process. In the sol-gel coating, a spray with a colloidal solution and a firing stage are repeated a predetermined times, and the predetermined times depend upon the thickness of the upper surface film.

For the upper surface films, a first solution is prepared by mixing 250 grams of ethyl silicate and 500 grams of ethyl alcohol, and a second solution contains 500 grams of isopropyl alcohol and 100 grams of triethoxyboran. The first and second solutions are mixed into various proportions for respective colloidal solutions. These colloidal solutions are respectively sprayed onto the lower surface films of the insulating foundations P61 to P74 at about 500 rpm. The colloidal solutions are dried in the atmospheric ambient at about 900 degrees in centigrade for about an hour. The spray stage and dry stage are repeated predetermined times, then the upper surface films are formed on the respective lower surface films as shown in Table 15.

Another colloidal solution is prepared by mixing the 347 grams of ethyl silicate, 500 grams of ethyl alcohol and 190.2 grams of diluted hydrochloric acid which is of the order of 0.3%, and the spray is carried out under the rotation of the foundations C31 to C33 at about 500 rpm for about 10 seconds. The foundations C31 to C33 thus sprayed are placed in a high temperature ambient at about 900 degrees in centigrade for about 10 minutes for the firing stage. The spray stage and the firing stage are repeated predetermined times, respectively, so that the silicon oxide films are formed on the comparative foundations C31 to C33, respectively. The upper film and the silicon oxide film are spray coated, however, the foundations may be dipped into the colloidal solutions for coating the upper film or the silicon oxide film, then lifting up at a constant speed ranging from 1 cm/min. to about 100 cm/min, then being dried, finally being subjected to a firing. Such a loop consisting of the dipping, the lifting, the drying and the firing is repeated a predetermined times for producing the upper film or the silicon oxide film with a predetermined thickness. (blank)

TABLE 15

| Reference mark | The upper oxide of silicon oxide | |
|---|---|---|
| | The content of $B_2O_3$ | Thickness (micron) |
| P61 | 5.1 | 0.01 |
| P62 | 20.2 | 0.2 |
| P63 | 30.6 | 0.7 |
| P64 | 37.1 | 0.9 |
| P65 | 48.7 | 8.7 |
| P66 | 7.4 | 0.03 |
| P67 | 9.8 | 0.5 |
| P68 | 19.9 | 1.9 |
| P69 | 50.0 | 10.0 |
| P70 | 46.2 | 7.6 |
| P71 | 31.6 | 5.4 |
| P72 | 21.3 | 1.2 |
| P73 | 8.4 | 0.6 |
| P74 | 9.6 | 0.1 |
| C31 | $SiO_2$ 100% | 0.1 |
| C32 | ditto | 5.2 |
| C33 | ditto | 9.5 |

The heat conductivity and the peeling strength are measured for the insulating substrates P61 to P64 and the comparative insulating substrates C31 to C33, and the peeling strength is measured not only immediately after the completion of the upper surface film or the silicon oxide film but also after repetition of a firing. Namely, a printing stage and a firing stage are repeated so that a quasi thick film circuit is completed. In the formation of the quasi thick film circuit the first sintered film is repeatedly subjected to the firing stage during the formation of the upper level films, and peeling strengths are measured immediately after the formation of the first sintered film as well as after the repetition of the firing operation. The laser flashing method and the tool shown in FIG. 2 are applied to these measurements. The results are described in Table 16. (blank)

TABLE 16

| Reference mark | Heat Conductivity (cal/sec. cm. deg) | Peeling strength (kg/4 mm$^2$) | |
|---|---|---|---|
| | | 1st. film | Quasi circuit |
| P61 | 0.591 | 4.0 | 3.9 |
| P62 | 0.580 | 4.3 | 4.0 |
| P63 | 0.601 | 4.4 | 4.3 |
| P64 | 0.531 | 4.9 | 4.9 |
| P65 | 0.410 | 4.2 | 4.0 |
| P66 | 0.594 | 4.9 | 4.8 |
| P67 | 0.539 | 4.8 | 4.8 |
| P68 | 0.501 | 5.0 | 5.1 |
| P69 | 0.426 | 5.2 | 5.2 |
| P70 | 0.507 | 4.1 | 3.8 |
| P71 | 0.511 | 4.2 | 4.0 |
| P72 | 0.499 | 5.3 | 5.0 |
| P73 | 0.523 | 4.8 | 4.8 |
| P74 | 0.531 | 4.9 | 4.9 |
| C31 | 0.576 | 0.1 | 0 |
| C32 | 0.501 | 0.2 | 0 |
| C33 | 0.472 | 0.3 | 0 |

The upper surface film containing the boron oxide enhances the adhesion between the circuit pattern and the insulating substrate without any substantial sacrifice of the heat conductivity, and, accordingly, provides a long service life to the insulating substrate. The insulating substrate shown in FIG. 4 may be also used for fabrication of a multi-level circuit substrate.

Although particular embodiments of the present invention have been shown and described, it will be obvious to those skilled in the art that various changes and modifications may be made without departing from the spirit and scope of the present invention.

What is claimed is:

1. An insulating substrate comprising
   (a) a foundation containing an aluminum nitride, at least one oxidizing agent selected from the group consisting of an yttrium oxide, and a calcium oxide and incidental impurities, said oxidizing agent ranging from about 0.1% to about 10% by weight, and
   (b) a multi-level surface film structure having a lower surface film of an aluminum oxide formed on a surface of said foundation and an upper surface film formed on the lower surface film and containing a silicon oxide, said lower surface film having a thickness ranging from about 0.2 micron to about 20 microns.

2. An insulating substrate as set forth in claim 1, in which said yttrium oxide is represented by the molecular formula of $Y_2O_3$.

3. An insulating substrate as set forth in claim 1, in which said calcium oxide is represented by the molecular formula of CaO.

4. An insulating substrate as set forth in claim 1, in which the average thickness of said lower surface film ranges from about 0.2 micron to about 20 microns.

5. An insulating substrate as set forth in claim 4, in which the average thickness of said upper surface film ranges from about 0.01 micron to about 10 microns.

6. An insulating substrate as set forth in claim 1, in which said upper surface film further contains a zirconium oxide ranging from about 10% to about 65% by weight and incidental impurities.

7. An insulating substrate as set forth in claim 6, in which the average thickness of said upper surface film is fallen within a range from about 0.01 micron to about 10 microns.

8. An insulating substrate as set forth in claim 6, in which said zirconium oxide is represented by the molecular formula of $ZrO_2$.

9. An insulating substrate as set forth in claim 1, in which said upper surface film further contains a titanium oxide ranging from about 10% to about 65% by weight.

10. An insulating substrate as set forth in claim 9, in which the average thickness of said upper surface film is fallen within a range from about 0.01 micron to about 10 microns.

11. An insulating substrate as set forth in claim 9, in which said titanium oxide is represented by the molecular formula of $TiO_2$.

12. An insulating substrate as set forth in claim 1, in which said upper surface film further contains a boron oxide ranging from about 5% to about 50% by weight.

13. An insulating substrate as set forth in claim 12, in which the average thickness of said upper surface film is fallen within a range from about 0.01 micron to about 10 microns.

14. An insulating substrate as set forth in claim 12, in which said boron oxide is represented by the molecular formula of $B_2O_3$.

15. An insulating substrate for a thick film circuit comprising
   a) a foundation containing an aluminum nitride, oxidizing agents of an yttrium oxide and a calcium oxide ranging from about 1.0% to about 8% by weight, and
   b) a multi-level surface film structure having a lower surface film containing an oxide, formed on a surface of said foundation and ranging from about 0.2 microns to about 20 microns, and an upper surface film of a silicon oxide formed on the lower surface film and ranging from about 0.01 microns to about 10 microns.

16. An insulating substrate as set forth in claim 15, in which said upper surface film further contains a substance selected from the group consisting of a zirconium oxide, a titanium oxide and a boron oxide.

17. An insulating substrate as set forth in claim 16, in which the average thickness of said upper surface film is fallen within a range from about 0.1 micron to about 10 microns.

18. A multi-level surface film structure forming a part of an insulating substrate and provided on a surface of a foundation, comprising:
   (a) a lower surface film containing an aluminum oxide and being formed on the surface of aid foundation, said lower surface film having a thickness ranging from about 0.2 micron to about 20 microns; and
   (b) an upper surface film formed on said lower surface film and containing a silicon oxide and a substance selected from the group consisting of a zirconium oxide, a titanium oxide and a boron oxide.

19. A thick film circuit comprising:
   (a) an insulating substrate having
      (a-1) a foundation containing an aluminum nitride, at least one oxidizing agent selected from the group consisting of a yttrium oxide and a calcium oxide, and incidental impurities,
      (a-2) a lower surface film provided on a surface of said foundation and containing an aluminum oxide, said lower surface film having a thickness ranging from about 0.2 micron to about 20 microns, and
      (a-3) an upper surface film provided on said lower surface film and containing a silicon oxide, a substance selected from the group consisting of a zirconium oxide, a titanium oxide and a boron oxide, and incidental impurities;
   (b) a conductive circuit pattern formed on the upper surface film and including resistive elements and interconnections; and
   (c) a plurality of circuit components.

* * * * *